US009325047B1

(12) United States Patent
Mumcu et al.

(10) Patent No.: US 9,325,047 B1
(45) Date of Patent: Apr. 26, 2016

(54) DYNAMICALLY RECONFIGURABLE BANDPASS FILTERS

(71) Applicants: Gokhan Mumcu, Tampa, FL (US); Timothy Joseph Palomo, Tampa, FL (US); Rasim Guldiken, Tampa, FL (US)

(72) Inventors: Gokhan Mumcu, Tampa, FL (US); Timothy Joseph Palomo, Tampa, FL (US); Rasim Guldiken, Tampa, FL (US)

(73) Assignee: University of South Florida, Tampa, FL (US)

( * ) Notice: Subject to any disclaimer, the term of this patent is extended or adjusted under 35 U.S.C. 154(b) by 72 days.

(21) Appl. No.: 14/204,646

(22) Filed: Mar. 11, 2014

Related U.S. Application Data

(60) Provisional application No. 61/776,229, filed on Mar. 11, 2013.

(51) Int. Cl.

| | |
|---|---|
| ***H03H 7/01*** | (2006.01) |
| ***H01P 1/20*** | (2006.01) |
| ***H01P 1/213*** | (2006.01) |
| *H01P 3/08* | (2006.01) |

(52) U.S. Cl.
CPC ........... *H01P 1/2135* (2013.01); *H03H 7/0138* (2013.01); *H03H 7/0161* (2013.01)

(58) Field of Classification Search
CPC ............................. H01P 1/20391; H01P 7/088
USPC .......................... 333/205, 223, 235, 175, 219
See application file for complete search history.

(56) References Cited

U.S. PATENT DOCUMENTS

| | | | | |
|---|---|---|---|---|
| 2005/0017819 A1 | | 1/2005 | Brown et al. | |
| 2005/0030133 A1 | | 2/2005 | Rawnick et al. | |
| 2008/0061909 A1 | * | 3/2008 | Kawai et al. | 333/235 |
| 2010/0156570 A1 | * | 6/2010 | Hong et al. | 333/219.1 |
| 2010/0271692 A1 | | 10/2010 | Hor et al. | |
| 2011/0215886 A1 | * | 9/2011 | Kawai et al. | 333/219 |
| 2012/0212395 A1 | * | 8/2012 | Sanada | 343/912 |

FOREIGN PATENT DOCUMENTS

| | | |
|---|---|---|
| JP | 2009302936 A * | 12/2009 |
| WO | 2005101565 A1 | 10/2005 |
| WO | 2012177369 A1 | 12/2012 |

OTHER PUBLICATIONS

A. R. Brown and G. M. Rebeiz, “A varactor-tuned RF filter,” IEEE Transactions on Microwave Theory and Techniques, vol. 48, No. 7, pp. 1157- 1160, My 2000.

K. Entesari and G. M. Rebeiz, “A differential 4-bit 6.5-10 GHz RF MEMS tunable filter,” IEEE Transactions on Microwave Theory and Techniques, vol. 53, No. 3, pp. 1103-1110, Mar. 2005.

(Continued)

*Primary Examiner* — Dean Takaoka
(74) *Attorney, Agent, or Firm* — Thomas | Horstemeyer, LLP

(57) ABSTRACT

In one embodiment, a dynamically reconfigurable bandpass filter includes a resonator loop and a microfluidic channel proximate to the resonator loop, the channel containing a conductor, wherein the position of the conductor within the channel can be adjusted to change capacitive loading of the resonator loop and therefore change the frequencies that the filter passes. In another embodiment, a filter includes a second resonator loop having comprising switches located at discrete positions along a length of the second resonator loop, wherein opening and closing of the switches changes the effective length of the second resonator loop to change capacitive loading of the first resonator loop.

19 Claims, 12 Drawing Sheets

(56) References Cited

OTHER PUBLICATIONS

T. Fujii, "PDMS-based microfluidic devices for biomedical applications," Microelectronic Engineering, vol. 61-2, pp. 907-914, Jul. 2002.

A. Gheethan, M. Chan Jo, R. Guildiken, and G. Mumcu, "Microfluidic based Ka-band beam scanning focal plane array," to appear in IEEE Antennas and Wireless Propagation Letters, available for download in IEEEExplore, 2013.

M. G. Hmeda and T. S. Kalkur, "Tunable patch antenna with BST capacitors," Integrated Ferroelectrics, vol. 141, pp. 112-119, 2013.

W. Irshad and D. Peroulis, "A 12-18 GHz electrostatically tunable liquid metal RF MEMS resonator with quality factor of 1400-1840," IEEE MTT-S Microwave Symposium Digest, 2011.

M. R. Khan, G. J. Hayes, S. Zhang, M. D. Dickey, and G. Lazzi, "A pressure responsive fluidic microstrip open stub resonator using a liquid metal alloy," IEEE Microwave and Wireless Components Letters, No. 99, pp. 1-3, 2012.

M. Li, and N. Behdad, "Fluidically tunable frequency selective/phase shifting surfaces for high-power microwave applications," IEEE Transactions on Antennas and Propagation, vol. 60, No. 6, pp. 2748-2759, 2012.

X. Liu, L. Katehi, W. Chappell, and D. Peroulis, "High-Q Tunable Microwave Cavity Resonators and Filters using SOI-based RF MEMS Tuners," Journal of Microelectromechanical Systems, Feb. 2010.

R. Marques, F. Mesa, J. Martel, and F. Medina, "Comparative analysis of edge—and broadside—coupled split ring resonators for metamatenal design-theory and experiments," IEEE Transactions on Antennas and Propagation, vol. 51, No. 10, pp. 2572-2581, Oct. 2003.

G. Mumcu, A. Dey, and T. Palomo, "Frequency-Agile Bandpass Filters Using Liquid Metal Tunable Broadside Coupled Split Ring Resonators," IEEE Microwave and Components Letters, vol. 23, No. 4, pp. 187-189, 2013.

S-J. Park and G. M. Rebeiz, "Low-loss two-pole tunable filters with three different predefined bandwidth characteristics," IEEE Transactions on Microwave Theory and Techniques, vol. 56, No. 5, pp. 1137-1148, May 2008.

I. Reines, S. J. Park, and G. M. Rebeiz, "Compact low-loss tunable X-band bandstop filter with miniature RF-MEMS switches," IEEE Transactions on Microwave Theory and Techniques, vol. 58, pp. 1887-1895, 2010.

D. Rodrigo, L. Jofre, and B. A. Cetiner, "Circular beam-steering reconfigurable antenna with liquid metal parasitics," IEEE Transactions on Antennas and Propagation, vol. 60, No. 4, pp. 1796-1802, Apr. 2012.

Y. Shim, Z. Wu, M. and M. Rais-Zadeh, "A high-performance continuously tunable MEMS bandpass filter at 1GHz," IEEE Transactions on Microwave Theory and Techniques, vol. 60, No. 8, pp. 2439-2447, Aug. 2012.

X. Y. Zhang, Q. Xue, C. H. Chan, and B-J. Hu, "Low-loss frequency-agile bandpass filters with controllable bandwidth and suppressed second harmonic," IEEE Transactions on Microwave Theory and Techniques, vol. 58, No. 6, pp. 1557-1564, Jun. 2010.

W. J. Keane, "Narrow-band YIG filters aid wide-open, receivers," Microwave, vol. 17, pp. 50-&, 1978.

B. J. Lei, A. Zamora, T. F. Chun, A. T. Ohta, and W. A. Shiroma, "A wideband, pressure-driven, liquid-tunable, frequency selective surface," IEEE Microwave and Wireless Components Letters, vol. 2, No. 9, pp. 465-467, Sep. 2011.

S. Guo, AB. J. Lei, W. A. Shiroma, and AS. T. Ohta, "A tunable low-pass filter using liquid-metal reconfigurable periodic defected ground structure," IEEE International MTT-S Microwave Sympoisum Digest, pp. 1-3, Jun. 2012.

* cited by examiner

DYNAMICALLY RECONFIGURABLE BANDPASS FILTERS

CROSS-REFERENCE TO RELATED APPLICATION(S)

This application claims priority to U.S. Provisional Application Ser. No. 61/776,229, filed Mar. 11, 2013, which is hereby incorporated by reference herein in its entirety.

BACKGROUND

Radio frequency (RF) filters that can be reconfigured to operate within a broad frequency range are highly desired to address the size requirements of emerging compact and multifunctional RF front-ends. The reconfigurable filter technologies that are currently being investigated mainly rely on material loadings, semiconductor varactor diodes, ferroelectric varactors, RF microelectromehanical system (MEMS) switches, and RF MEMS varactors. The performance of these filters is limited by the frequency tunability and/or power handling of their varactors. For example, the frequency tuning range of varactor diode based filters is typically below 30%. RF MEMS technology enables the fabrication of miniaturized filters, but the frequency tuning range is small unless the tuning is performed in a discrete manner. Evanescent mode cavity resonator filters controlled with MEMS-based actuators have been shown to offer a high frequency tuning range, but these filters generally exhibit large electrical sizes due to their volumetric construction.

In view of the limitations of current reconfigurable bandpass filters, it can be appreciated that it would be desirable to have alternative reconfigurable bandpass filters that do not suffer from such limitations.

BRIEF DESCRIPTION OF THE DRAWINGS

The present disclosure may be better understood with reference to the following figures. Matching reference numerals designate corresponding parts throughout the figures, which are not necessarily drawn to scale.

DETAILED DESCRIPTION

Although various reconfigurable bandpass filters have been developed, their performance is often limited in terms of size, frequency tuning range, and power handling. Disclosed herein are dynamically reconfigurable bandpass filters that provide significantly enhanced frequency tuning ranges and power handling capabilities from a compact device size. The filters comprise single or multiple resonator loops whose effective lengths can be dynamically adjusted to tune the frequencies that pass. In some embodiments, the effective length of the resonator loop is adjusted by moving a conductor, such as a volume of conductive liquid or a conductive plate, through a microfluidic channel so as to change the degree to which the conductor capacitively couples to a further resonator loop of the filter. In other embodiments, the effective length of the resonator loop is adjusted using micromechanical (MEMS) switches.

In the following disclosure, various specific embodiments are described. It is to be understood that those embodiments are example implementations of the disclosed inventions and that alternative embodiments are possible. All such embodiments are intended to fall within the scope of this disclosure.

As described above, reconfigurable bandpass filters are disclosed that comprise resonator loops whose effective lengths can be adjusted to tune the frequencies that the filter passes. Described first is a filter having resonator loops whose, effective length can be adjusted using a conductive liquid, such as a liquid metal. More particularly, described is broadside-coupled split-ring resonators (BC-SRRs) having a microfluidic channel that defines the length and shape of one of the resonator's loops. Frequency tuning can be accomplished by adjusting the amount of conductive liquid that is present within the channel. With this configuration, the tuning range is limited by the physical separation of the loops of the BC-SRR. Because this distance can be made very small, wideband tunability can be accomplished. The filter is promising for high-power radio frequency (RF) applications because of the highly linear nature of its tuning mechanism. Moreover, the filter is suitable for small applications because the filter can be fabricated to have a miniature footprint.

Figure 1A:
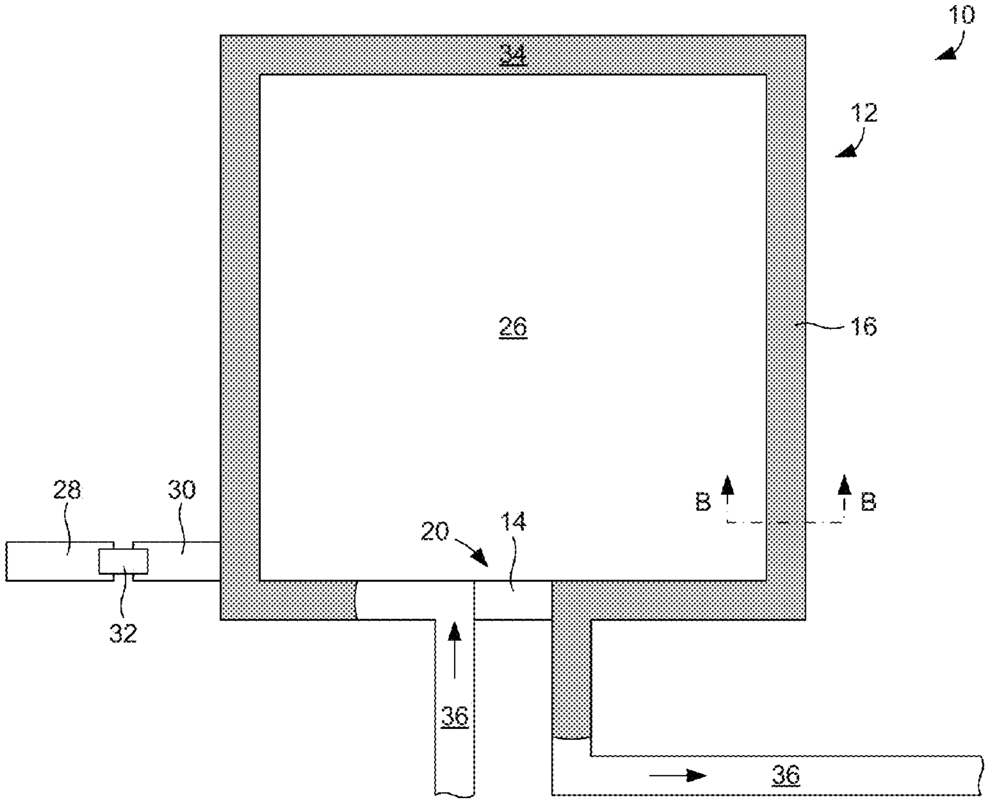
FIG. 1A is a schematic diagram of a first embodiment of a dynamically reconfigurable bandpass filter.

FIG. 1A illustrates an embodiment of a dynamically reconfigurable bandpass filter 10 that is configured as a BC-SRR. As shown in that figure, the filter 10 comprises a resonator 12 that includes a bottom resonator loop 14 and a top resonator loop 16, each of which being an open loop resonator. The top loop 16 is positioned above the bottom loop but spaced therefrom by a layer of dielectric material (see FIG. 1B). For clarity, each loop 14, 16, is separately illustrated in FIGS. 1C and 1D, respectively. In the illustrated embodiment, the loops 14, 16 are generally rectangular. Regardless of their shapes, however, the loops 14, 16 have similar dimensions and configurations. Each loop 14, 16 includes a gap 18, 20 along one of its sides such that the loops are open. As is apparent from FIGS. 1A, 1C, and 1D, the gaps 18, 20 are positioned on opposite sides of the resonator 12 (i.e., displaced 180° from each other) so that they do not overlap. The bottom loop 14 comprises a solid element (e.g., trace) that is made of an electrically-conductive material, such as copper. The top loop 16, however, comprises a microfluidic channel through which conductive liquid can be driven. The size of the loops 14, 16 can be varied to fit the application. As an example, however, each side (arm) of the loops 14, 16 can have a length, l, that is approximately 19 mm and a width, w, that is approximately 1.2 mm (FIGS. 1C and 1D), and the gaps 18, 20 can be approximately 2.6 mm wide.

Figure 1B:
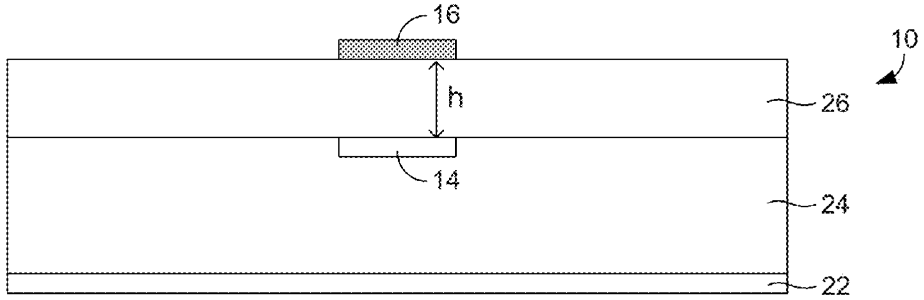
FIG. 1B is a cross-sectional view of the filter of FIG. 1A taken along line B-B.

FIG. 1B shows a cross-section of the filter 10 taken along line B-B in FIG. 1A. As indicated in FIG. 1B, the filter 10 can comprise a stack of materials that includes a ground plane 22, a substrate 24, and a polymer layer 26. As is further indicated in the drawing, the bottom loop 14 is formed in the substrate 24 and the top loop 16 is formed on the polymer layer 26. By way of example, the polymer layer 26 can be approximately 13 mil thick, in which case the distance between the loops 14, 16 is approximately 13 mil.

Figure 1C:
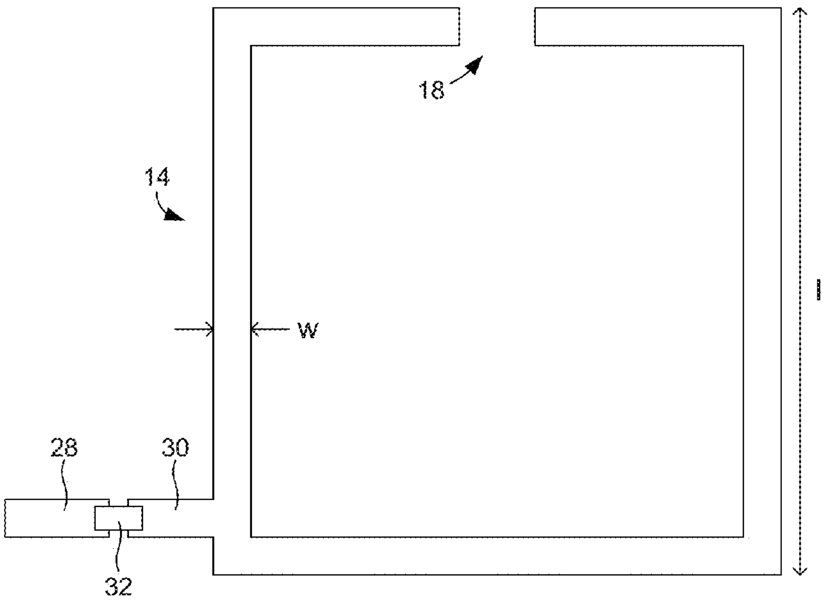
FIG. 1C is a plan view of a bottom resonator loop of the filter of FIG. 1A.
Figure 1D:
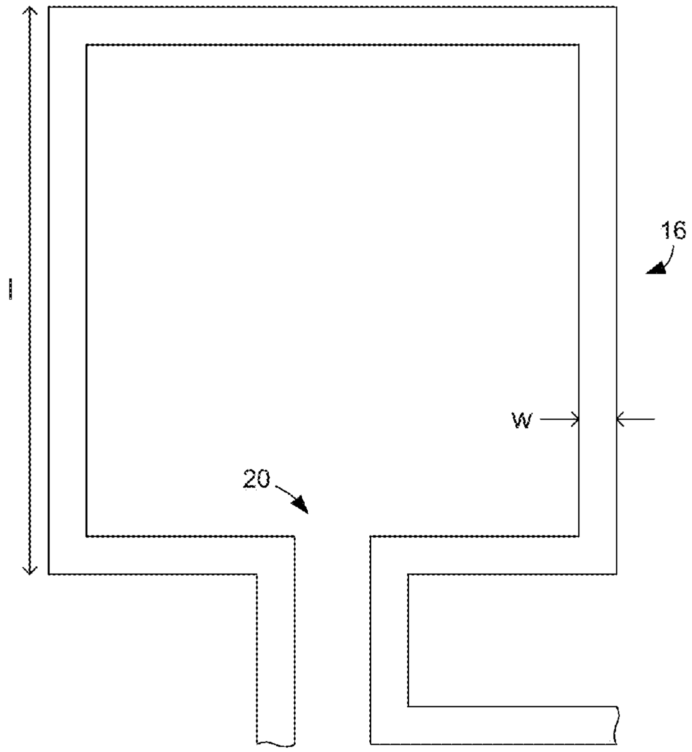
FIG. 1D is a plan view of a top resonator loop of the filter of FIG. 1A.

As shown in FIG. 1C, the filter 10 also comprises an RF input port 28. In the illustrated embodiment, the input port 28 is coupled to a feed line 30 of the bottom loop 14 with a coupling inductor 32.

With reference back to FIG. 1A, provided within the microfluidic channel of the top loop 16 is a continuous volume of conductive liquid 34. The conductive liquid 34 can be a liquid metal, such as mercury or a eutectic alloy comprising gallium, indium, and tin (e.g., Galinstan™). Also provided within the channel at each end of the volume of conductive liquid 34 is a dielectric fluid 36, such as a polytetrafluoroethylene (PTFE) solution ($\in_r$=2.2), which is used to adjust the location of the volume of conductive liquid within the channel. When the dielectric fluid 36 is driven along the channel, for example by a micropump (not shown), the top loop 16 can be completely filled with, partially filled with, or completely emptied of the conductive liquid 34. Accordingly, the effective length of the top loop 16 can be adjusted to change the capacitive loading between the top loop and the bottom loop 14 and, therefore, change the frequencies that can be passed by the filter 10. With the dimensions described above, the resonator 12 resonates at approximately 850 MHz when there is no conductive liquid 34 in the top loop 16 (i.e., when the effective length of the loop is zero). When the top loop 16 is completely filled with conductive liquid 34 and it has its maximum effective length, however, the resonator 12 resonates at its lowest frequency of approximately 630 MHz. Frequencies between these two extremes can be tuned by partially filling the top loop 16 with the conductive liquid 34.

Figure 1E:
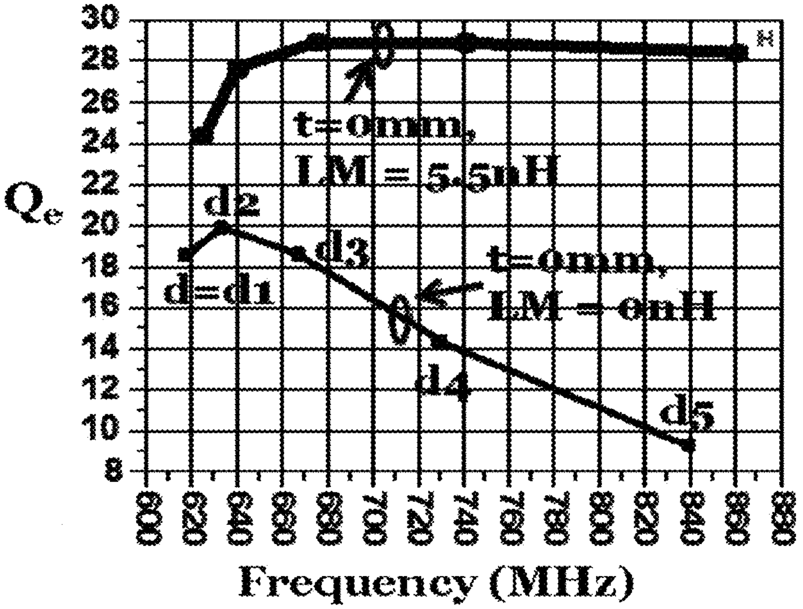
FIG. 1E is a graph that plots $Q_e$ as a function of frequency for the filter of FIG. 1A.

The required external quality factor $Q_e$ and coupling coefficient k of a second-order Butterworth coupled resonator filter can be calculated from its low-pass lumped circuit prototype (g0=g3=1, g1=g2=1.4142) as $Q_e$=g0·g1/FBW=28 and k=FBW/sqrt(g1·g2)=0.0354 for a fractional bandwidth (FBW) of 5%. Such a filter can exhibit a well-matched, constant FBW performance if $Q_e$ and k are relatively constant over the tuning range of the resonator. As depicted in FIG. 1E, the $Q_e$ of the conductive liquid-based BC-SRR shown in FIG. 1A significantly decreases as it is tuned to higher frequencies. This behavior is independent of the tapping location t. The coupling inductor (LM) 32 shown in FIG. 1A stabilizes the variation in $Q_e$ over the tuning range. The reactance of the inductor 32 is proportional to the frequency and counteracts the reduction in $Q_e$ at higher frequencies.

Parametric studies were conducted using Agilent's Advanced Design System (ADS) and a tapping location of t=0 mm with LM=5.5 nH was determined to provide a relatively constant $Q_e$ over the operational band. These studies were performed by simultaneously considering five different conductive liquid locations (d=d1=0, d2=7, d3=16.5, d4=26, d5=35.5 mm), which are identified as data points in the design curves presented in the graphs of FIGS. 1B, 2B, 3B, and 3C. It is possible to tap the conductive liquid resonator with different layout arrangements (such as using multiple circuit elements and alternative tapping locations) to provide other types of desired performance variations (such as constant absolute bandwidth) as the operation frequency is tuned.

Figure 2B:
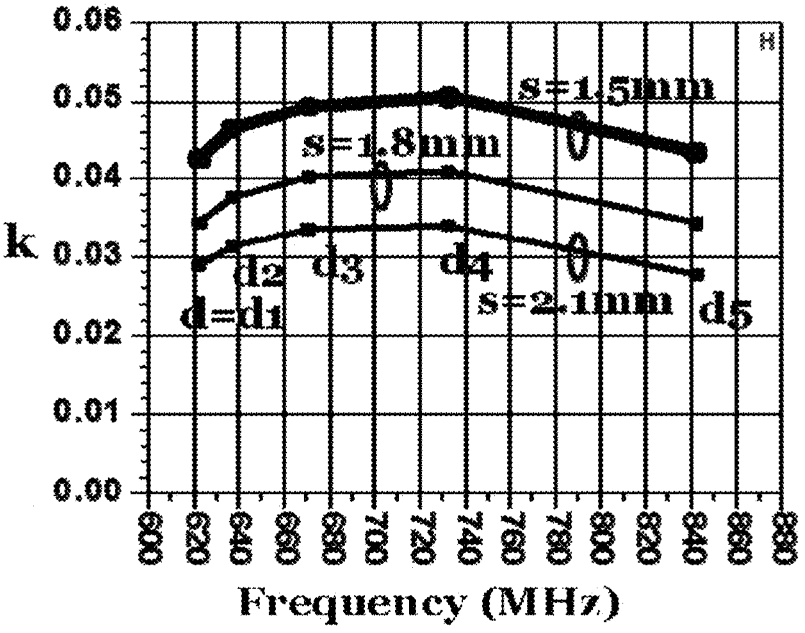
FIG. 2B is a graph that plots k as a function of frequency for the filter of FIG. 2A.
Figure 2A:
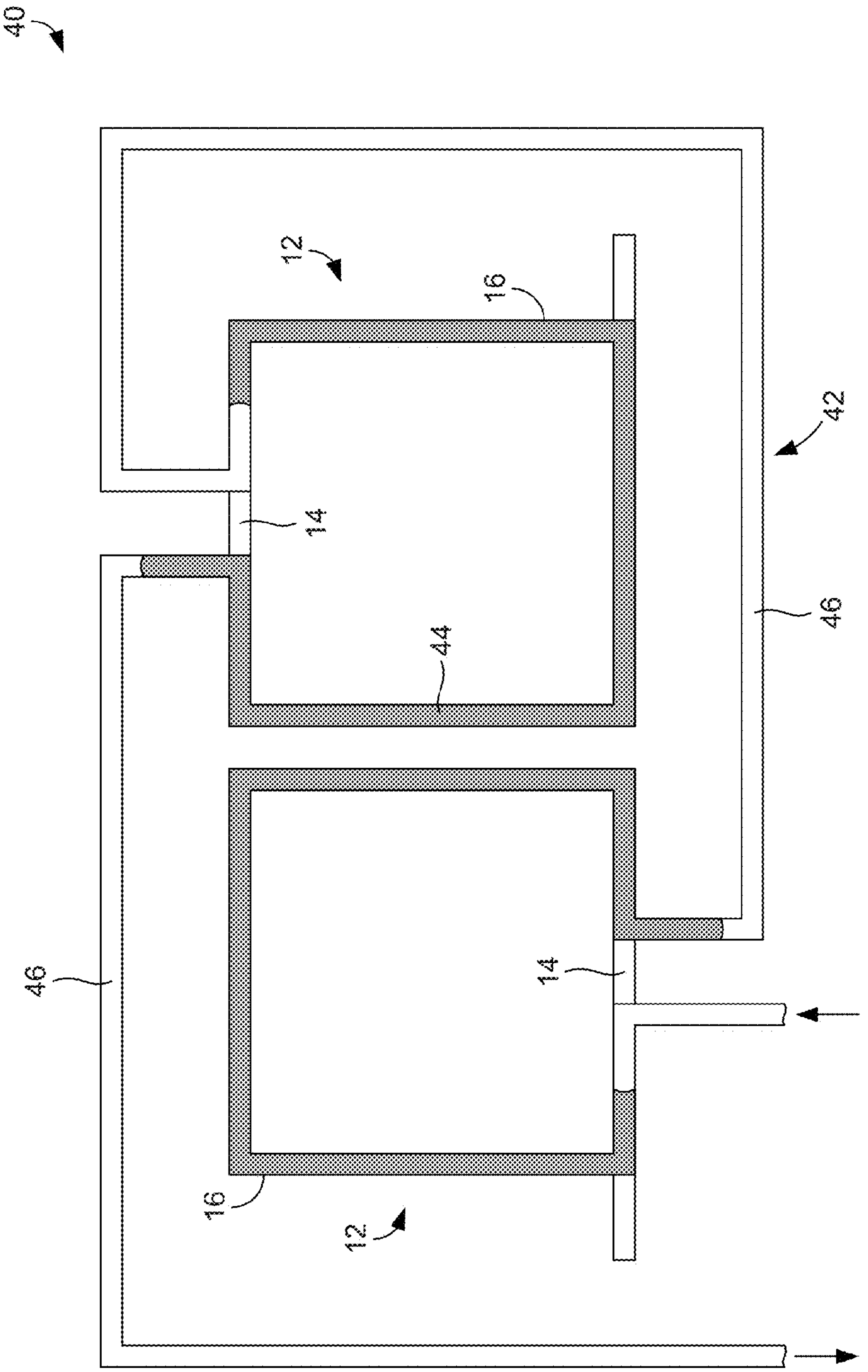
FIG. 2A is a schematic diagram of a second embodiment of a dynamically reconfigurable bandpass filter.

To achieve a constant FBW response over the frequency range, a relatively constant coupling coefficient k is needed. This can be achieved with the 180°-rotated configuration shown in FIG. 2A. In FIG. 2A, a dynamically reconfigurable bandpass filter 40 comprises two resonators 12 that are positioned such that they are 180° out of phase from each other. Each resonator 12 has a configuration similar to that described above in relation to FIGS. 1A-1D and, therefore, comprises a bottom resonator loop 14 (conductor trace) and a top resonator loop 16 (microfluidic channel). As is apparent from FIG. 2A, the top loops 16 of both resonators 12 are formed by the same continuous microfluidic channel 42, which contains two independent volumes of conductive liquid 44 that are separated by a dielectric fluid 46. With such a configuration, the amount of conductive liquid 44 in each top loop 16 can be simultaneously controlled. The channel 42 forms a closed-loop system that, in some embodiments, can be dynamically reconfigured using series-connected micropumps controlled with a microprocessor (not shown). By way of example, the resonators 12 can be separated by approximately 1.8 mm to ensure that the minimum filter bandwidth is at least 5% over the tuning range. In such a case, k is 0.035 at the edges and 0.04 at the middle of the operation band.

While the resonators 12 in FIGS. 1A and 2A are shown having square loops, it is noted that non-rectangular resonator shapes can be employed with lumped coupling capacitors to realize different tunable bandwidth characteristics, such as increasing, decreasing, or constant absolute bandwidth. Such shape modifications may also provide better $Q_e$ and k stability over frequency. It is further noted that while BC-SRR resonators have been explicitly illustrated and discussed, other resonators can be similarly adjusted using conductive liquid. For example, the effective length of a single open loop resonator can be altered using conductive liquid.

Figure 3A:
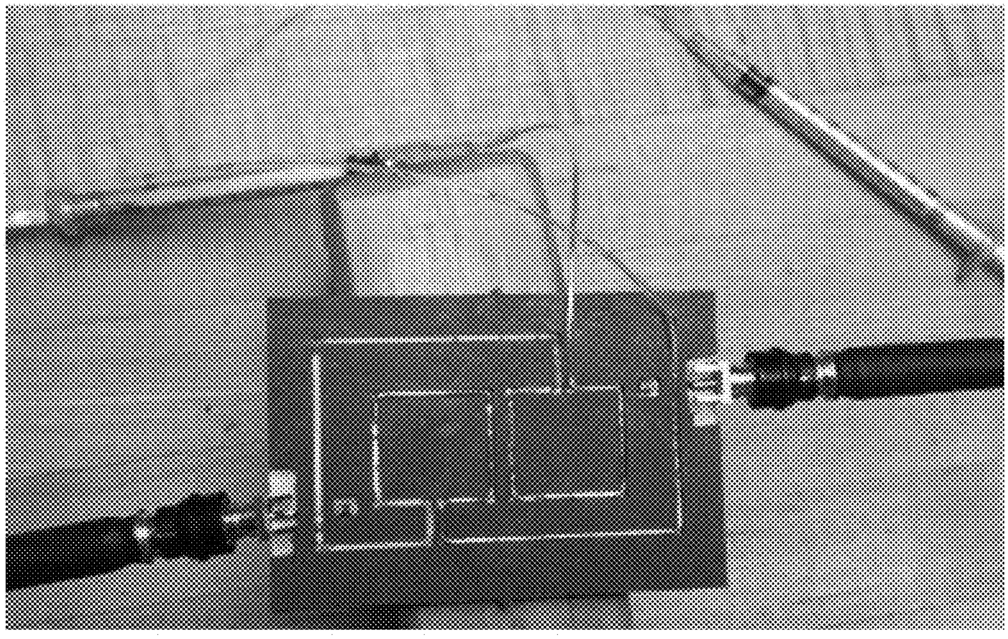
FIGS. 3A and 3B are images of components of an experimental dynamically reconfigurable bandpass filter.
Figure 3B:
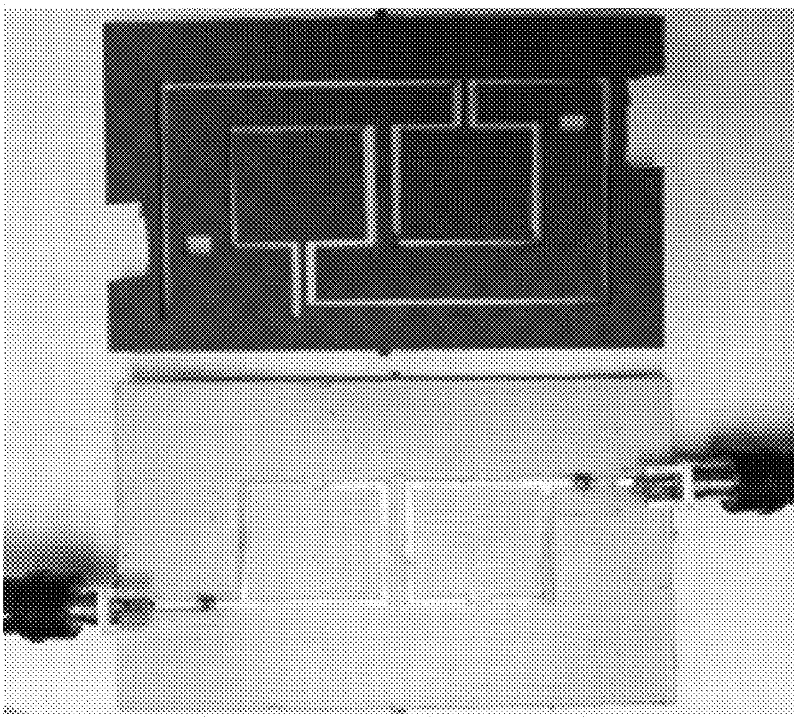

FIGS. 3A and 3B show components of an experimental dynamically reconfigurable bandpass filter that was constructed using polytetrafluoroethylene (PTFE) tubing to form the top loops of the BC-SRR. The PTFE tubing had a 16 mil (0.4064 mm) inner radius and a 6 mil (0.1524 mm) wall thickness. The bottom loops of the resonator were formed by 50Ω microstrip lines having a 1.2 mm width. The PTFE tubing was accurately aligned and positioned over the bottom loops by milling cut-outs through low-loss 1.575 mm thick Rogers 5880 substrate ($\in_r$=2.2, tan δ=0.0009). The tubes were stabilized in their locations using Scotch™ tape. Mercury and Galinstan™ are two types of liquid metals that can be employed for the filter. Although Galinstan™ can be sticky because of oxidation, it can still be moved through the PTFE tubing with the aid of Teflon™ solution (AF 400S2-100-1, 1% Teflon™ powdered resin dissolved in 3M FC-40, acquired from DuPont). Because of its non-toxicity, Galinstan™ (δ=3.46×10[6]) was selected for the experimental verifications.

Figure 3C:
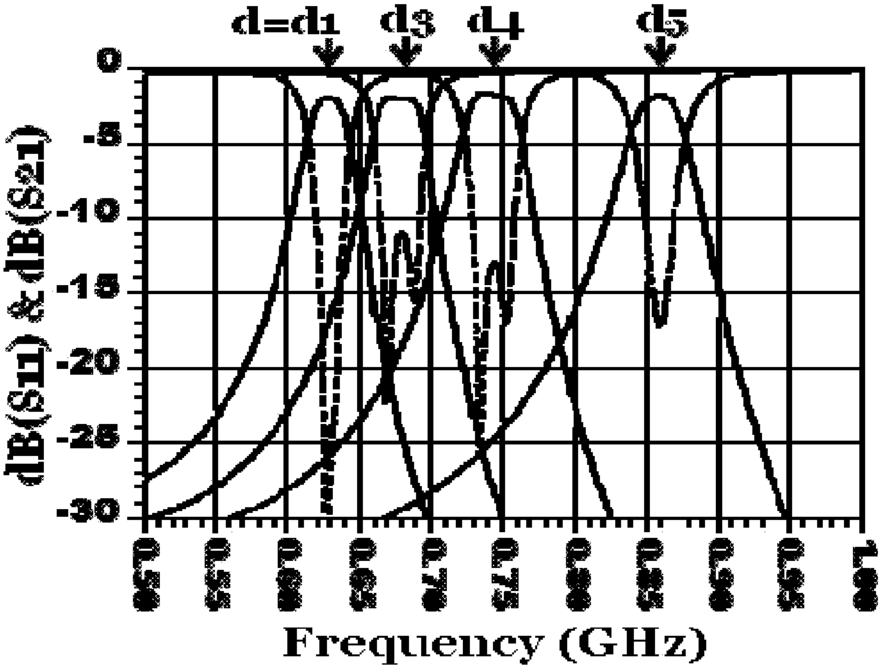
FIG. 3C is a graph that plots simulated S-parameters for the filter of FIGS. 3A and 3B.

The liquid metal and Teflon™ solutions were controlled with two syringes, as depicted in FIG. 3A. The ADS simulations of the overall filter for various d values using LM=5.5 nH coupling inductors resulted in a return loss that was not well matched (<8 dB). To alleviate this issue, a parametric sweep was carried out over the complete filter models. For t=0 mm, increasing the coupling inductors to LM=12 nH was found to provide a return loss performance greater than 10 dB over the whole frequency range, as shown in FIG. 3C. The inductors were acquired from the Coilcraft 0805CS series and were modeled to exhibit a Q of 50 at 850 MHz. The simulated insertion loss was about 2 dB throughout the operation band. The inductor-, dielectric-, and conductor-based insertion losses were 0.26 dB, 0.29 dB, and 1.49 dB, respectively, at the lowest frequency of operation. As compared to a copper-based implementation, the additional insertion loss because of Galinstan™ was simulated to be 0.59 dB.

Figure 3D:
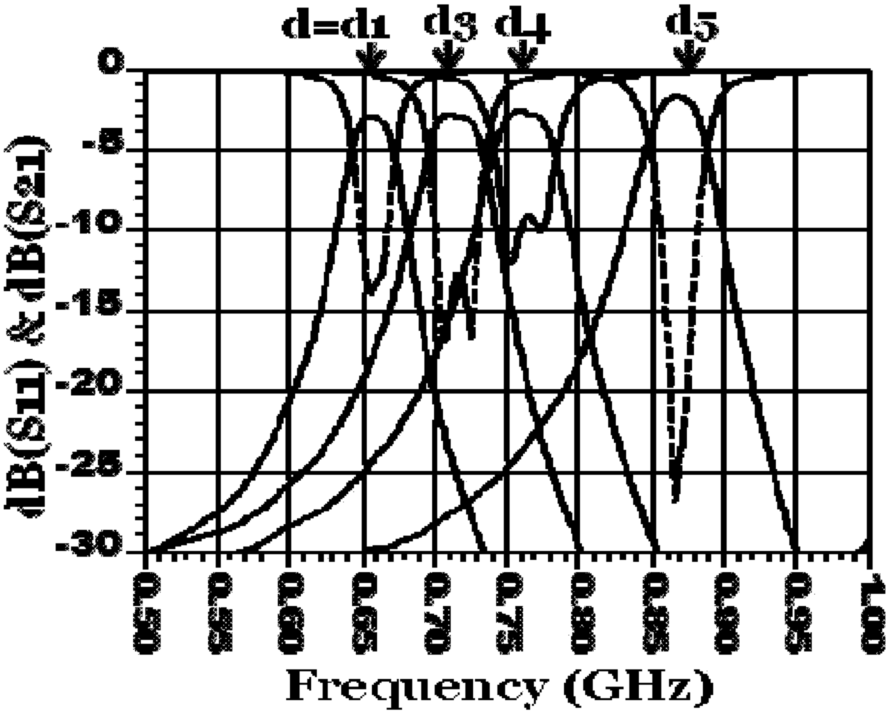
FIG. 3D is a graph that plots measured S-parameters for the filter of FIGS. 3A and 3B.

FIG. 3D shows the measured performance of the filter. LM=10 nH was experimentally determined to provide the best greater than 10 dB return loss performance. The measured filter responses were about 20 MHz higher than the simulated data. The measured insertion loss was 3 dB at the lowest frequency and 1 dB higher than the simulated performance. The resonance frequency deviation can be associated with the dielectric constant tolerances, overlaid substrate used for guiding the tubing, and undesired air gaps that may have existed between the tubing and the printed loops. The insertion loss deviation was likely because of the unaccounted loss of the PTFE tubing, overlaid substrate, and Scotch™ tape. The filter exhibited a measured tunability from 650 to 870 MHz with near constant 5% −3 dB FBW. The footprint of the resonators was about 20×40 mm$^2$.

Figure 4A:
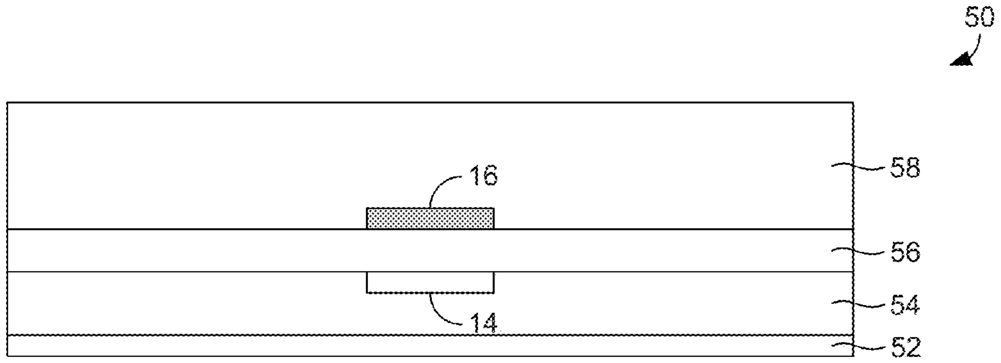
FIG. 4A is a cross-sectional view of a further experimental dynamically reconfigurable bandpass filter.
Figure 4B:
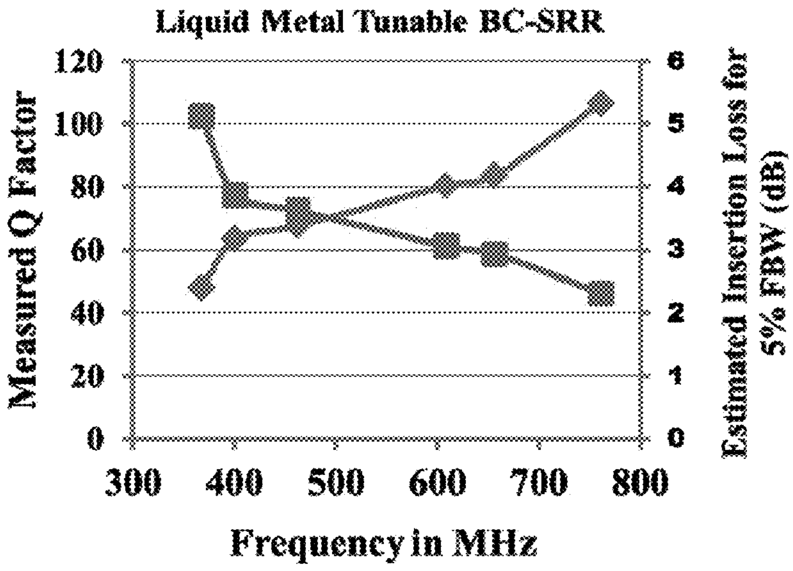
FIG. 4B is a graph that plots the measured performance of the filter of FIG. 5A.

As noted above, the tuning range of a BC-SRR filter such that described in relation to FIG. 2A is limited by the physical separation between the loops of the BC-SRR. The tunability range of such filters can be significantly extended using microfabrication techniques that bring the liquid metal physically closer to the bottom loop of the BC-SRR. Testing was performed utilizing a 2 mil (i.e., 50.8 μm) thick liquid crystal polymer (LCP) layer as the insulator between the liquid metal loop and the printed loop of a BC-SRR. The configuration of the dynamically reconfigurable bandpass filter is shown in FIG. 4A. As indicated in this figure, the filter 50 comprised a ground plane 52, a bottom substrate 54, the liquid crystal polymer layer 56, and a host substrate 58 made of polydimethylsiloxane (PDMS). The bottom loop 14 was formed in the bottom substrate 54 and the top loop 16 was formed in the host substrate 58. As shown in FIG. 4B, a tunability range of 2:1 was experimentally verified from 400 MHz to 800 MHz with Q factors greater than 50. The Q factor can be further improved by utilizing an ultra-thin low-loss insulator such as benzocyclobutene (BCB). Further Q improvements can be accomplished by preparing the channel mold within a lower loss substrate, such as quartz instead of PDMS. Specifically, the numerical simulations predict greater than 4:1 frequency tunability with Q factors greater than 100 over the majority of this wide tuning range when a quartz and 1 mil (i.e., 25.4 μm) thick BCB-based implementation is pursued over alumina substrate. The resonators can be enclosed within a cavity to achieve more improvements in their Q factor.

Although slower than semiconductor- and MEMS-based implementations, the tuning speeds of conductive liquid filters such as those described above can be less than milliseconds by using ultra-thin microfluidic channels. Piezoelectric-based micropumps can be utilized for convenient control of the tuning mechanism. The design can also be generalized to higher order tunable filters that are controlled only with a single micropump.

Figure 5A:
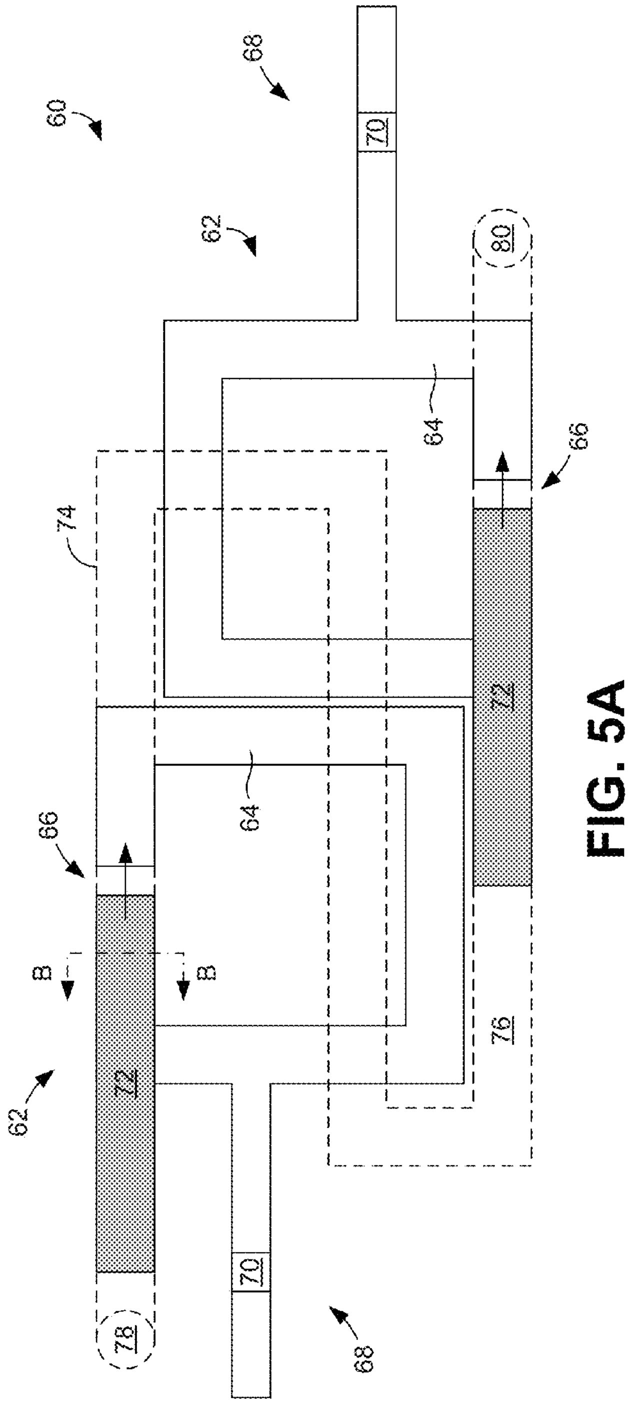
FIG. 5A is a schematic diagram of a third embodiment of a dynamically reconfigurable bandpass filter.
Figure 5B:
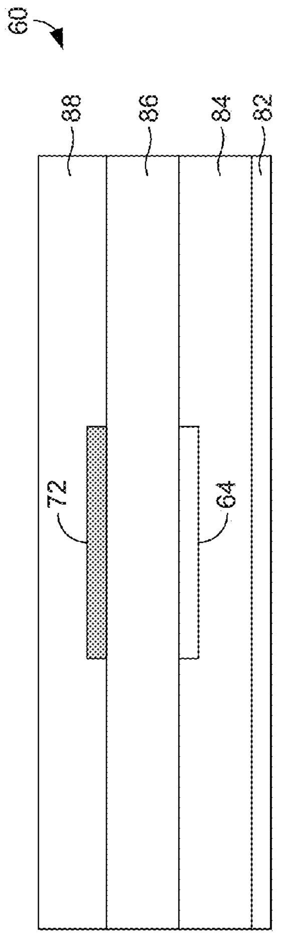
FIG. 5B is a cross-sectional view of the filter of FIG. 5A taken along line B-B.
Figure 5C:
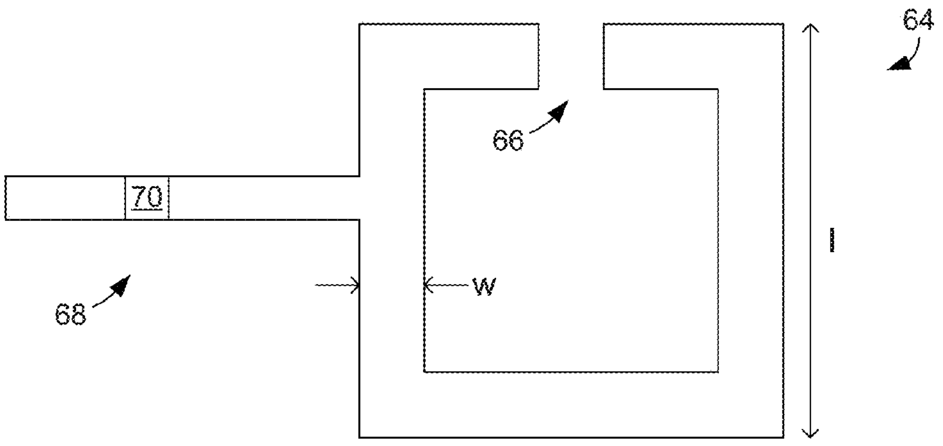
FIG. 5C is a plan view of a bottom resonator loop of the filter of FIG. 5A.

FIGS. 5A-5C illustrate a dynamically reconfigurable bandpass filter 60 that is similar in many ways to the BC-SRR-based filter 40 shown in FIG. 2A described above. Accordingly, the filter 60 comprises two resonators 62, each including a bottom resonator loop 64. One of these loops 64 is shown in FIG. 5C. As indicated there, the loop 64 comprises a continuous trace (e.g., of copper) that defines a rectangle having a gap 64 along one side. With reference back to FIG. 5A, the two loops 64 are inverted relative to each other in the filter 60 so that the gaps 66 are provided on opposite sides of the filter. By way of example, each side (arm) of the loops 64 can have a length, l, that is approximately 10 mm and a width, w, that is approximately 2 mm (FIG. 5C). The loops 64 can be spaced from each other a distance, c, of approximately 0.4 mm (FIG. 5A). The gaps 66 can be approximately 2 mm wide (FIG. 5C). As shown in FIGS. 5A and 5C, each loop 64 further comprises an extension 68 that serves as an RF input port or an RF output port, depending upon the loop 64. Each of these extensions 68 comprises a coupling inductor 70.

Rather than comprising a compete top resonator loop, the resonators 62 each comprise a top conductor 72, which each can be considered to form a partial resonator loop. The conductors 72 can be moved relative to the bottom loops 64 to capacitively load them and change the frequencies that can be passed by the filter 60. In some embodiments, the conductors 72 comprise volumes of conductive liquid that can be driven through a continuous microfluidic channel 74 that passes over portions of the bottom loops 64. In other embodiments, the conductors 72 comprise conductive plates that can be driven through the microfluidic channel 74. Irrespective of the nature of the conductors 72, the degree to which the conductors capacitively load their bottom loops 64 depends upon the extent to which the conductors overlap the loops and, more particularly, the extent to which the conductors overlap the gaps 66 of the loops. Although the conductors 72 do not overlap the bottom loops 62 to the same degree to which the upper loops 16 can overlap the bottom loops 14 of the filter 40 in FIG. 2A, nearly the same level of capacitive loading can be achieved.

When the top conductors 72 comprise conductive plates, they can be metal plates. Alternatively, the conductive plates can comprise non-metal plates upon which metal has been deposited. For example, the conductive plates can be metallized glass plates. Regardless, the conductive plates can be driven through the microfluidic channel 74 using a suitable dielectric fluid 76, such as PTFE solution. In such a case, the microfluidic channel 74 can comprise an inlet 78 and an outlet 80 through which the fluid can flow under the driving force of a micropump (not shown).

FIG. 5B shows a cross-section of the filter 60 taken along line B-B in FIG. 5A. As indicated in FIG. 5B, the filter 60 can comprise a stack of materials that includes a ground plane 82, a substrate 84, an LCP layer 86, and a polymer layer 88. The bottom loop 64 is formed in the substrate 84 and the microfluidic channel 74 is formed in the polymer layer 88. By way of example, the LCP layer 86 is be approximately 25.4 μm thick.

Because the filter 60 uses an ultra-thin layer between the bottom loops 64 and the top conductors 72, the frequency tuning range of the filter is increased. In embodiments in which the top conductors 72 are conductive plates, long-term reliability, insertion loss performance, and associated power handling capability are also increased. When the filter 60 has the dimensions described above, it can operate from approximately 0.9 to 1.5 GHz with a constant FBW. As such, the frequency tuning range is greatly improved as compared to the above-described embodiments. In addition, the filter exhibits an IL less than 1.7 dB across its tuning range, which is approximately 1.3 dB better than the filter described in relation to FIGS. 4A and 4B.

The filter 60 is tuned by moving the conductors 72 over the gaps 66 of the bottom loops 62, as indicated by the arrows illustrated FIG. 5A. The conductors 72 create a capacitive loading effect across the gaps 66 and therefore cause a shift in the resonance frequency of the bottom loops 64. Depending on the position of the conductors 72, the amount of capacitive loading varies and gets maximized (i.e., $C_{max}$) when the conductor 72 is centered over the loop's side (arm). Most importantly, this capacitive loading can be completely removed (i.e., $C_{min}=0$) by retracting the conductors 72 out of the gaps 66. This enables an extended range of tuning capability as compared to varactors. By using a 25.4 μm thick LCP insulator between the bottom loops 64 and the conductors 72, the tuning range was reduced to 0.9 GHz.

The conductors 72 need to be precisely moved over the bottom loops 64 to obtain a reconfigurable, constant-FBW response. Positioning the leading edge of the conductor 72 approximately 10 mm from the edge of the bottom loop 64 causes zero capacitive loading and the filter 60 operates at 1.5 GHz. On the other hand, when the leading edge of the conductor 72 is approximately 4 mm from the edge of the bottom loop 64, the capacitive loading increases and the filter 60 operates at 0.9 GHz, providing 50% frequency tuning range. As expected, the insulator layer thickness significantly affects the tuning range of the filter. For example, increasing the insulator thickness from 25 μm to 50 μm decreases the frequency tuning range by more than half.

Figure 6:
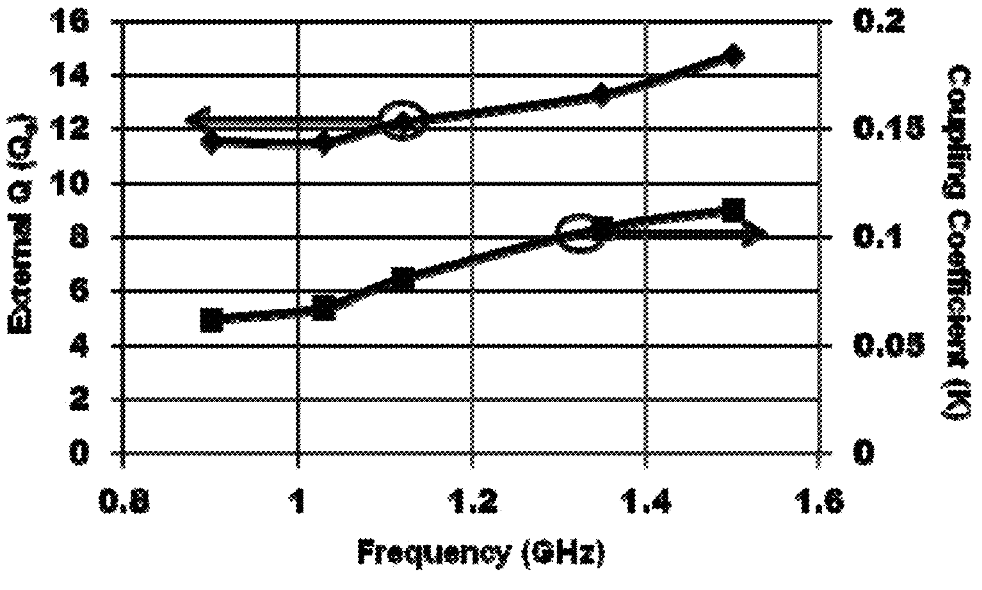
FIG. 6 is a graph that plots the variation of coupling coefficient (K) and external quality factor (Qe) as a function of frequency for Lm=2.5 nH.

To design a two-pole Chebyshev bandpass filter with 5% FBW, the required external quality factor (Qe) and coupling coefficient (K) were calculated from its lowpass lumped circuit prototype (g0=1, g1=0.6648, g2=0.5445, g3=1.2210) to be 13.296 and 0.0831, respectively. To maintain a constant FBW, it is necessary to keep the Qe and K relatively constant over the frequency tuning range. The ADS studies were performed by simultaneously considering five different configurations in which the leading edge of a metallized plate was respectively spaced 4, 4.5, 4.7, 6, and 10 mm from the edge of the bottom loop. These are locations identified as data points in the plots of FIGS. 6 and 7. The tapping location that resulted in the required quality factor was found to be T=6.1 mm. The lumped inductors 70 were utilized to stabilize the variation of Qe over the frequency tuning range. The values of these inductors 70 were determined by utilizing an iterative approach involving ADS schematics and Momentum layouts. The value that provided the required coupling across the entire frequency range was found to be 2.5 nH. The ADS simulations of the overall filter for various P values using the 2.5 nH coupling inductors resulted in a return loss that is not well matched (<8 dB). A parametric sweep was carried out over the complete filter model. Increasing the coupling inductors to 7 nH was found to provide a return loss performance great than 10 dB over the whole frequency range. However, this resulted in 8% constant FBW performance. Due to the proof-of-concept nature of the work, no further optimizations were pursued to lower the FBW back to 5%. The IL was less than 1.3 dB over the entire frequency tuning range.

The meandered microfluidic channel layout shown in FIG. 5A was can be employed to enable simultaneous turning of the resonators 62 and can a single micropump. As shown in FIG. 5A, one of the bottom loops 64 was shifted downward relative to the other loop to prevent the conductors 72 from overlapping both loops at the same time. Detailed curves depicting the variation of the external quality factor and the coupling coefficient as a function of frequency are provided in FIG. 6.

A dynamically reconfigurable bandpass filter having a configuration similar to that shown in FIG. 5A was fabricated for testing purposes. During the fabrication, microfluidic channels were fabricated in PDMS utilizing a micromolding technique. Metallized glass plates were positioned inside the channels prior to the bonding the PDMS to an LCP layer. The PDMS mold was bonded to the LCP layer using an APTES (3-aminopropyltriethoxysilane) treatment. The PDMS and LCP bond was then aligned with a printed circuit board (PCB) using the alignment holes. Plastic screws and clamps were utilized to hold the PCB and channel layers together. Cubic pieces of PDMS were utilized as microfluidic connectors to interface PTFE tubes with the channels. To move the plates inside the channels, a two-syringe system was implemented to flow Teflon™ solution inside the channels. The final filter stack comprised a 1.27 mm thick PCB board, a 25.4 μm thick LCP layer, and a 2 mm thick PDMS substrate with 250 μm deep and 2.1 mm wide channels with 1.9 mm wide metallized glass plates.

Figure 7A:
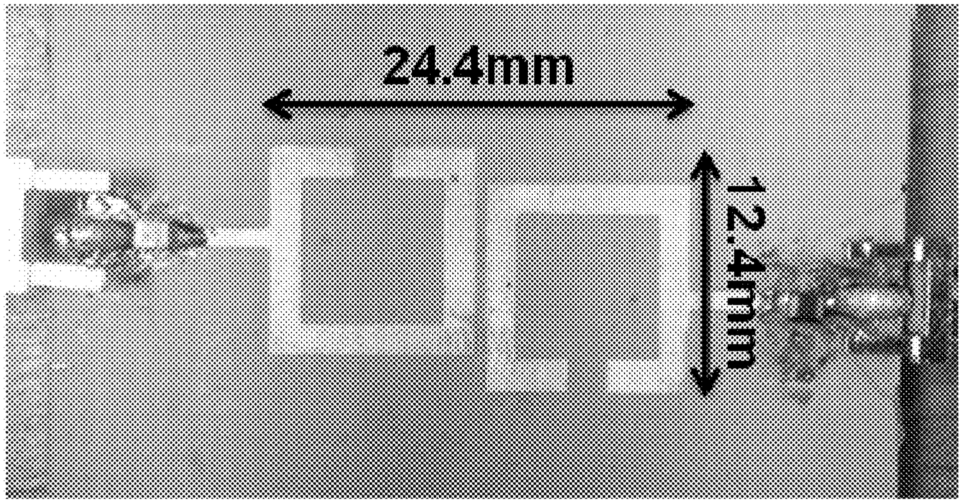
FIGS. 7A and 7B are images of components of a further experimental dynamically reconfigurable bandpass filter.
Figure 7B:
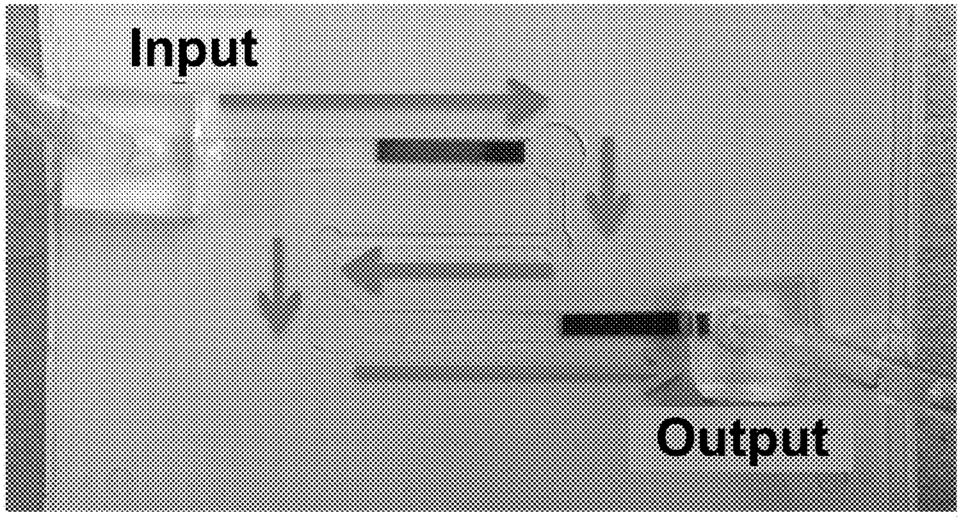
Figure 7C:
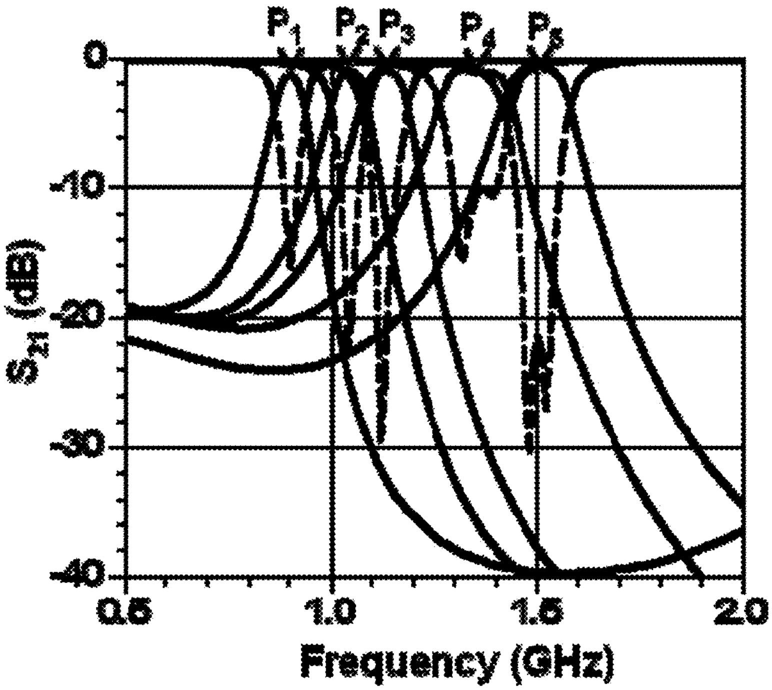
FIG. 7C is a graph that plots simulated insertion and return loss performances for the filter of FIG. 7A.
Figure 7D:
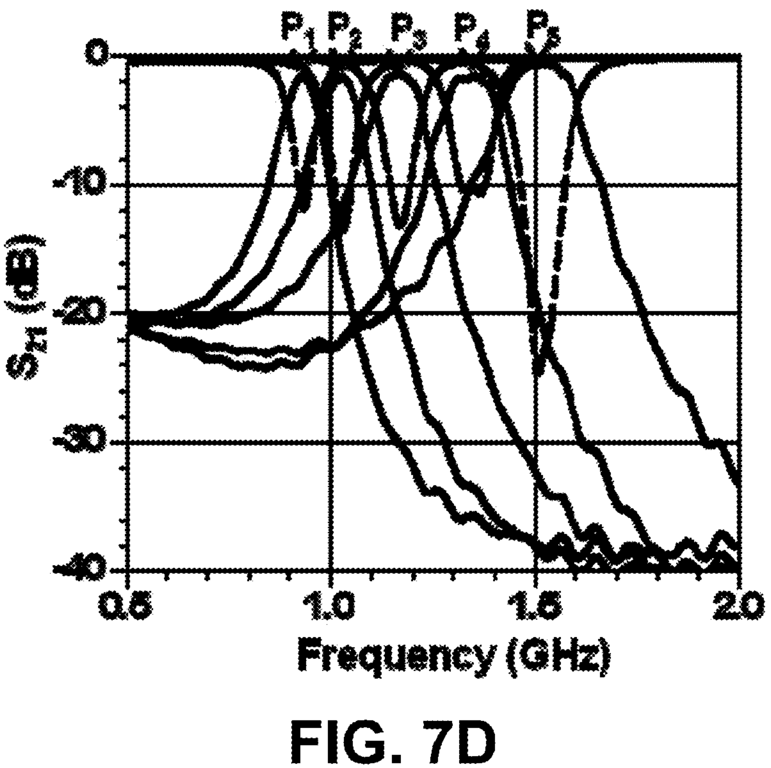
FIG. 7D is a graph that plots measured insertion and return loss performances for the filter of FIG. 7A.

The layers of the fabricated filter are shown in FIGS. 7A and 7B. 6.8 nH Coilcraft inductors from the 0805CS series were utilized at the input and output of the filter. As shown in FIGS. 7C and 7D, the measured insertion and return loss performances were in good agreement with the simulated results. A frequency tunability range of 50% (1.5 GHz to 0.9 GHz) was accomplished by moving the metallized glass plates a distance of 6 mm (i.e., P1 to P5) over the open loop resonators. The worst case insertion loss was found to be 1.7 dB at the lowest frequency, which differed from the simulation results by 0.4 dB. The difference in IL between the simulations and measurements was due to the lower Q of the inductors, which was modeled as 50 in ADS simulations. The FBW was measured to vary between 8% and 10% from 0.9 GHz to 1.5 GHz. Increasing the number of poles of the filter would help stabilize FBW variation as lower coupling and external quality factors will be required. The overall footprint of the filter was 24.4×12.4 $mm^2$, which is $0.073\times0.037\lambda_0^2$ ($\lambda_0$=free space wavelength) at the lowest frequency.

Figure 8A:
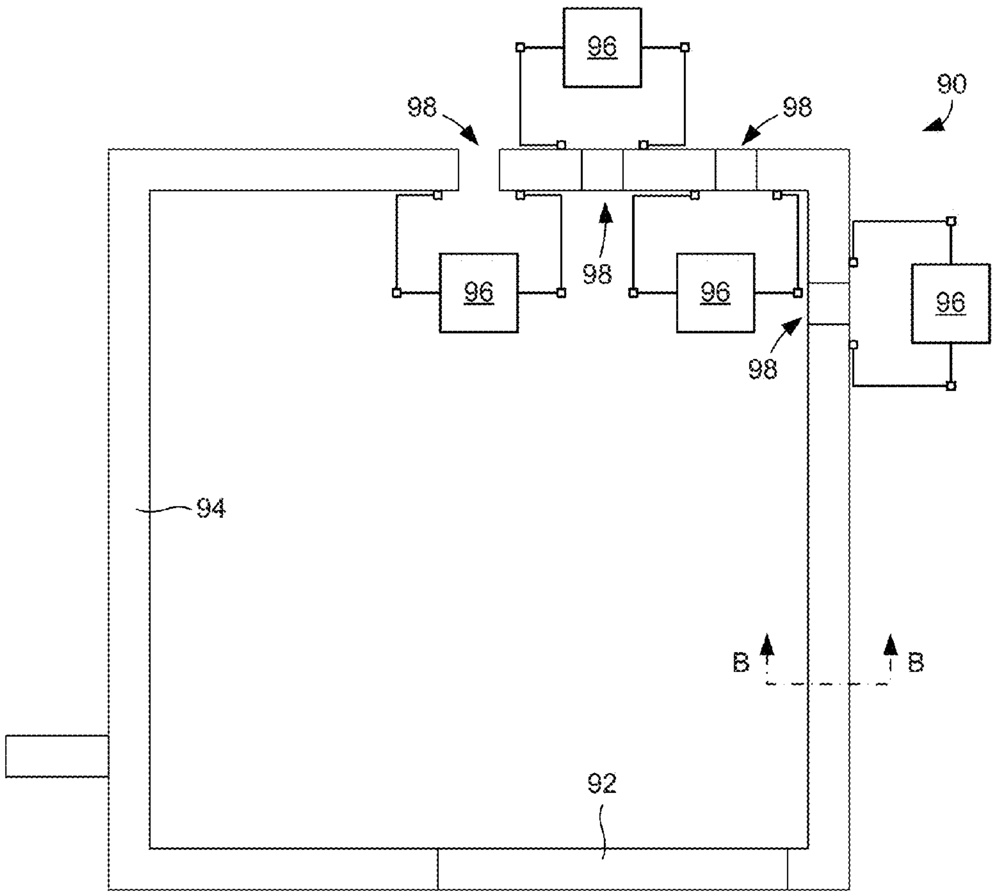
FIG. 8A is a schematic diagram of a fourth embodiment of a dynamically reconfigurable bandpass filter.
Figure 8B:
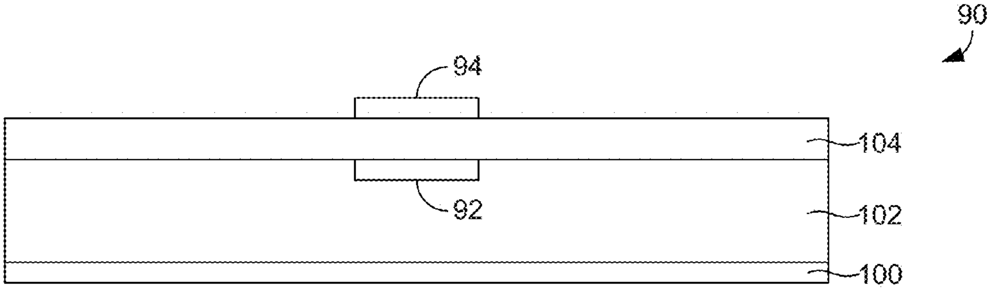
FIG. 8B is a cross-sectional view of the filter of FIG. 8A taken along line B-B.

A functionality similar to that described above can be achieved by using switches positioned at discrete positions around a loop of a resonator. FIGS. 8A and 8B illustrate an example of such a resonator 90. The resonator 90 is configured as a BC-SRR having a bottom resonator loop 92 and a top resonator loop 94. Instead of comprising conductive liquid or a conductive plate that moves through a microfluidic channel, however, the top loop 94 is a conductive trace that includes multiple MEMS switches 96 that span gaps 98 positioned along the length of the trace. By individually controlling the switches 96, the effective length of the top loop 94 can be adjusted. As an example, if all of the switches 96 are closed, the effective length of the loop 94 is the entire trace. If the first (leftmost) switch is opened, however, the effective length of the loop 94 will be halved.

FIG. 8B shows a cross-section of the filter 90 taken along line B-B in FIG. 8A. As indicated in FIG. 8B, the filter 90 can comprise a stack of materials that includes a ground plane 100, a substrate 102, and an LCP layer 104. As is further indicated in the drawing, the bottom loop 92 is formed in the substrate 102 and the top loop 94 is formed on the LCP layer 104. By way of example, the LCP layer 104 can be approximately 8 mil thick.

Using switches in the manner shown in FIG. 8A provides the advantage of faster tuning because the switches can be operated nearly instantaneously. However, the filter 90 may have greater insertion losses because of the presence of the switches.

The invention claimed is:

1. A dynamically reconfigurable bandpass filter comprising:

a resonator loop; and a microfluidic channel proximate to the resonator loop, the channel containing a conductor, wherein the position of the conductor within the channel can be adjusted to change capacitive loading of the resonator loop and therefore change the frequencies that the filter passes.

2. The filter of claim 1, wherein the resonator loop comprises a conductive trace formed on a substrate.

3. The filter of claim 1, wherein the resonator loop is a split ring resonator.

4. The filter of claim 3, wherein the microfluidic channel forms a further split ring resonator that overlaps the resonator loop such that the filter is a broadside-coupled split-ring resonator (BC-SRR).

5. The filter of claim 1, wherein the microfluidic channel further contains a dielectric fluid that can be used to drive the conductor through the channel.

6. The filter of claim 5, wherein the dielectric fluid is a polytetrafluoroethylene solution.

7. The filter of claim 1, wherein the conductor comprises a volume of conductive liquid.

8. The filter of claim 7, wherein the conductive liquid is mercury or a eutectic alloy comprising gallium, indium, and tin.

9. The filter of claim 1, wherein the conductor is a conductive plate.

10. The filter of claim 9, wherein the conductive plate comprises a metallized plate.

11. The filter of claim 1, wherein the filter comprises two or more resonators positioned in proximity to each other, each resonator comprising a resonator loop a microfluidic chamber in which a conductor is provided.

12. The filter of claim 11, wherein the microfluidic chambers are connected so as to form a continuous microfluidic chamber that the conductors share.

13. A dynamically reconfigurable bandpass filter comprising:

a first resonator loop; and a second resonator loop proximate to the first resonator loop, the second resonator loop comprising multiple conductive segments separated by open gaps located at discrete positions along a length of the second resonator loop with a switch spanning each gap so as to connect adjacent segments together, wherein opening and closing of the switches electrically decouples and couples the adjacent segments so as to changes the effective length of the second resonator loop to change capacitive loading of the first resonator loop and therefore change the frequencies that the filter passes.

14. The filter of claim 13, wherein the first and second resonator loops are overlapping split ring resonators such that the filter is a broadside-coupled split-ring resonator (BC-SRR).

15. The filter of claim 13, wherein the switches are micromechanical switches.

16. The filter of claim 13, wherein the filter comprises two or more resonators positioned in proximity to each other, each resonator comprising a first resonator loop comprising a conductive trace and a second resonator loop proximate to the first resonator loop comprising switches located at discrete positions along a length of the second resonator loop.

17. A method for reconfiguring a bandpass filter having a first resonator loop and a second resonator loop proximate to the first resonator loop, the method comprising:

adjusting an effective length of the second resonator loop to change capacitive loading of the first resonator loop and change the frequencies that the filter passes, wherein adjusting the effective length of the second resonator loop comprises moving a volume of conductive liquid through a microfluidic channel of the second resonator loop.

18. A method for reconfiguring a bandpass filter having a first resonator loop and a second resonator loop proximate to the first resonator loop, the method comprising:

adjusting an effective length of the second resonator loop to change capacitive loading of the first resonator loop and change the frequencies that the filter passes, wherein adjusting the effective length of the second resonator loop comprises opening or closing one or more switches located at gaps between conductive segments of the second resonator loop to decouple or couple one or more adjacent traces.

19. A method for reconfiguring a bandpass filter having a first resonator loop and a second resonator loop proximate to the first resonator loop, the method comprising:

adjusting an effective length of the second resonator loop to change capacitive loading of the first resonator loop and change the frequencies that the filter passes, wherein adjusting the effective length of the second resonator loop comprises moving a conductive plate through a microfluidic channel of the second resonator loop.

* * * * *